(12) United States Patent
Bulzacchelli et al.

(10) Patent No.: US 8,558,611 B2
(45) Date of Patent: Oct. 15, 2013

(54) PEAKING AMPLIFIER WITH CAPACITIVELY-COUPLED PARALLEL INPUT STAGES

(75) Inventors: John F. Bulzacchelli, Yonkers, NY (US); Ping-Hsuan Hsieh, Taipei (TW)

(73) Assignee: International Business Machines Corporation, Armonk, NY (US)

(*) Notice: Subject to any disclaimer, the term of this patent is extended or adjusted under 35 U.S.C. 154(b) by 58 days.

(21) Appl. No.: 13/372,709

(22) Filed: Feb. 14, 2012

(65) Prior Publication Data
US 2013/0207722 A1  Aug. 15, 2013

(51) Int. Cl.
*H03F 3/68* (2006.01)
(52) U.S. Cl.
USPC ..................................... 330/85; 330/124 R
(58) Field of Classification Search
USPC ........................................ 330/85, 124 R, 295
See application file for complete search history.

(56) References Cited

U.S. PATENT DOCUMENTS

| | | | |
|---|---|---|---|
| 4,081,759 A * | 3/1978 | Yen | 330/295 |
| 6,531,931 B1 | 3/2003 | Benyamin et al. | |
| 6,738,432 B2 | 5/2004 | Pehlke et al. | |
| 6,747,512 B2 * | 6/2004 | Madni | 330/69 |
| 6,750,717 B1 | 6/2004 | Kobayashi et al. | |
| 6,771,124 B1 | 8/2004 | Ezell | |
| 6,897,712 B2 | 5/2005 | Ficken et al. | |
| 6,937,054 B2 | 8/2005 | Hsu et al. | |
| 7,183,842 B1 * | 2/2007 | Wai et al. | 330/98 |
| 7,271,623 B2 | 9/2007 | Palmer | |
| 7,453,306 B2 | 11/2008 | Baumgartner et al. | |
| 7,586,374 B2 | 9/2009 | Bouny | |
| 7,764,091 B2 | 7/2010 | Jiang | |
| 7,839,212 B2 | 11/2010 | Huang et al. | |

OTHER PUBLICATIONS

T. Beukema et al., "A 6.4-Gb/s CMOS SerDes Core With Feed-Forward and Decision-Feedback Equalization," IEEE Journal of Solid-State Circuits, Dec. 2005, pp. 2633-2645, vol. 40, No. 12.
S. Galal et al., "10-Gb/s Limiting Amplifier and Laser/Modulator Driver in 0.18-µm CMOS Technology," IEEE Journal of Solid-State Circuits, Dec. 2003, pp. 2138-2146, vol. 38, No. 12.
S. Gondi et al., "Equalization and Clock and Data Recovery Techniques for 10-Gb/s CMOS Serial-Link Receivers," IEEE Journal of Solid-State Circuits, Sep. 2007, pp. 1999-2011, vol. 42, No. 9.

* cited by examiner

*Primary Examiner* — Henry Choe
(74) *Attorney, Agent, or Firm* — Anne V. Dougherty; Ryan, Mason & Lewis, LLP

(57) ABSTRACT

Analog peaking amplifiers with enhanced peaking capability are provided. For example, a peaking amplifier circuit includes an input node, output node, a feedback node, a first input amplifier having an input connected to the input node and an output connected to the feedback node, a second input amplifier having an input connected to the input node, a coupling capacitor connected between an output of the second input amplifier and the feedback node, a forward-path gain amplifier having an input connected to the feedback node and an output connected to the output node, and a feedback circuit having an input coupled to the output node and an output connected to the feedback node. A peaking response of the peaking amplifier circuit is realized by capacitively coupling the output of the second input amplifier to the feedback node to suppress negative feedback and increase the peaking gain at higher frequencies.

23 Claims, 7 Drawing Sheets

20

40

50

PEAKING AMPLIFIER WITH CAPACITIVELY-COUPLED PARALLEL INPUT STAGES

TECHNICAL FIELD

The field generally relates to electronic circuits for boosting high-frequency signals and more specifically to analog peaking amplifiers with enhanced peaking capability.

BACKGROUND

Peaking amplifiers are used in electronic systems where a peaking characteristic in a frequency transfer function (i.e., higher gain at high frequencies than at low frequencies) is needed. One important application for peaking amplifiers is signal equalization. For instance, when high-speed (e.g., multi-Gb/s) digital data streams are transferred over electrical serial links, the transmitted pulses are distorted by high-frequency losses in the channel media. To improve the maximum data rates of such links, it is necessary to equalize the frequency response of the channel so that the pulse distortion is reduced. For this reason, the receivers of modern high-speed data communication links commonly employ peaking amplifiers, which boost the high-frequency components of the received signal that were attenuated by the channel response.

SUMMARY

Exemplary embodiments of the invention generally include analog peaking amplifiers with enhanced peaking capability. In one exemplary embodiment, a peaking amplifier circuit includes an input node, output node, a feedback node, a first input amplifier, a second input amplifier, a forward-path gain amplifier, a feedback circuit, and a coupling capacitor The first input amplifier has an input connected to the input node and an output connected to the feedback node. The second input amplifier has an input connected to the input node. The coupling capacitor is connected between an output of the second input amplifier and the feedback node. The forward-path gain amplifier has an input connected to the feedback node and an output connected to the output node. The feedback circuit has an input coupled to the output node and an output connected to the feedback node. A peaking response of the peaking amplifier circuit is realized by capacitively coupling the output of the second input amplifier to the feedback node to suppress negative feedback and increase the peaking gain at higher frequencies.

In other exemplary embodiments of the invention, the feedback circuit is an active feedback amplifier. Further, the first input amplifier and the active feedback amplifier may be transconductance amplifiers that share a same load resistor. The second input amplifier or the forward-path gain amplifier, or both, may be a transconductance amplifier. A low-pass filter circuit may be connected between the output of the forward-path gain amplifier and the input of the active feedback amplifier.

In yet other exemplary embodiments of the invention, the coupling capacitor of the peaking amplifier circuit is a variable coupling capacitor. Further, a control circuit is provided to vary a capacitance of the variable coupling capacitor to tune a peaking response of the peaking amplifier circuit. The variable coupling capacitor may include a plurality of n capacitors connected in parallel, wherein the control circuit includes a plurality of switching elements that are switchably controlled by a peaking control signal to switchably connect corresponding ones of the n capacitors to the feedback node.

In another exemplary embodiment of the invention, a method for amplifying a signal by a peaking amplifier includes receiving an input signal at an input of first and second input amplifiers, amplifying the input signal with the first and second input amplifiers, applying an output of the first input amplifier to a feedback node to which negative feedback is applied to reduce a gain of the peaking amplifier at DC and low operating frequencies, and capacitively coupling an output of the second input amplifier to the feedback node to suppress the negative feedback and increase the gain of the peaking amplifier at high operating frequencies.

These and other exemplary embodiments and features of the present invention will become apparent from the following detailed description of exemplary embodiments thereof, which is to be read in connection with the accompanying drawings.

DETAILED DESCRIPTION OF EXEMPLARY EMBODIMENTS

Figure 1:
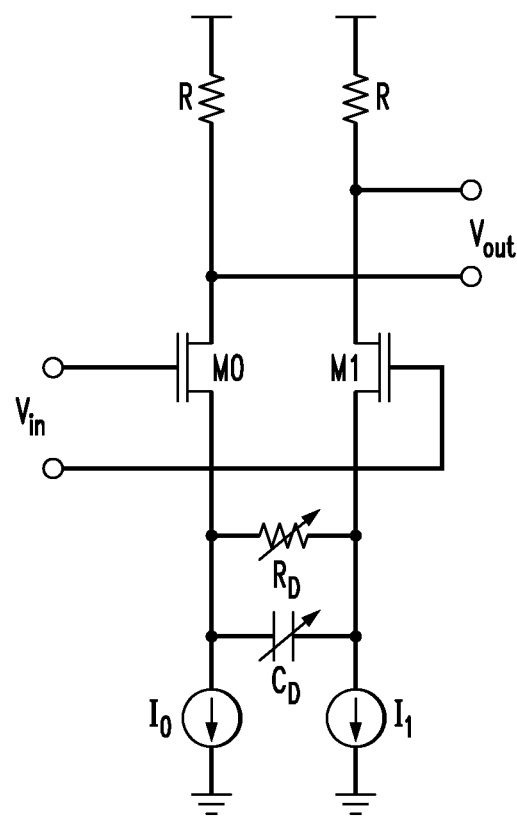
FIG. 1 is a schematic circuit diagram of a zero-peaked differential amplifier.

Exemplary embodiments of the invention will now be discussed in further detail with regard to analog peaking amplifiers with enhanced peaking capability. In general, for applications in which operating frequencies to be boosted exceed 1 GHz, a peaking amplifier is typically realized as a "zero-peaked differential amplifier". FIG. 1 is a schematic circuit diagram of a conventional zero-peaked differential amplifier. In particular, FIG. 1 depicts a zero-peaked differential amplifier 10, which comprises a resistor-loaded current-mode logic (CML) stage. The amplifier stage 10 comprises a differential input stage formed by differential transistor pair M0 and M1 and load resistors R. The gates of transistors M0 and M1 are differential inputs that receive as input a differential voltage Vin. The drains of transistors M0 and M1 are output nodes that output a differential voltage Vout.

The amplifier stage 10 further comprises a variable degeneration resistor $R_D$ and a variable degeneration capacitor $C_D$ forming a degeneration network, as well as tail current sources I0 and I1 providing DC current for DC biasing the amplifier stage 10. The DC gain of the amplifier stage 10 is set by adjusting the resistor $R_D$ to provide the desired resistive degeneration. The use of the degeneration resistor $R_D$ provides a more linear, lower distortion response characteristic, which is desirable for analog applications. The variable capacitance $C_D$ in parallel with the degeneration resistor $R_D$ is utilized to introduce a "zero" in the frequency response, so that the high-frequency gain is higher than the DC gain at a desired peaking frequency. At this peaking frequency, the degeneration capacitor $C_D$ essentially shorts out the degeneration resistor $R_D$ resulting in a higher gain. The amount of peaking (how much the high-frequency gain is boosted relative to the DC gain) can be adjusted by varying the resistance $R_D$ and/or capacitance $C_D$ in the degeneration network.

The achievable peaking is one key figure-of-merit for a peaking amplifier design. In current CMOS technologies (65 nm and forward), a single-stage design with the amplifier of FIG. 1 can provide roughly 6 dB of nominal peaking while maintaining a DC gain equal to or larger than 0 dB. In practice, process variations can reduce the peaking by 2 dB, leaving only 4 dB of achievable maximum peaking. For equalizing the most difficult electrical channels, higher peaking (>10 dB) is typically required. To achieve higher peaking gain, an amplifier can be constructed by cascading several stages, but each stage contributes additional variability and non-linearity to the entire amplifier chain.

Another drawback with a cascaded topology is the varying input capacitance. The peaking nature of the frequency response changes the gain over different frequencies and therefore modulates the magnitude of the Miller Effect affecting the input capacitance. As a result, while the peaking behavior increases the high-frequency gain of the peaking amplifier, the larger input capacitance due to stronger Miller Effect at high frequencies loads a previous stage more heavily and thereby causes additional loss. Moreover, the extent of change in the input capacitance depends on the amount of peaking, which can be set by digital peak control bits switching in the degeneration resistors and/or capacitors. Due to this interaction among various stages, the peaking of multiple cascaded stages may not be as high as that predicted by characterizing individual stages (in isolation).

Figure 2:
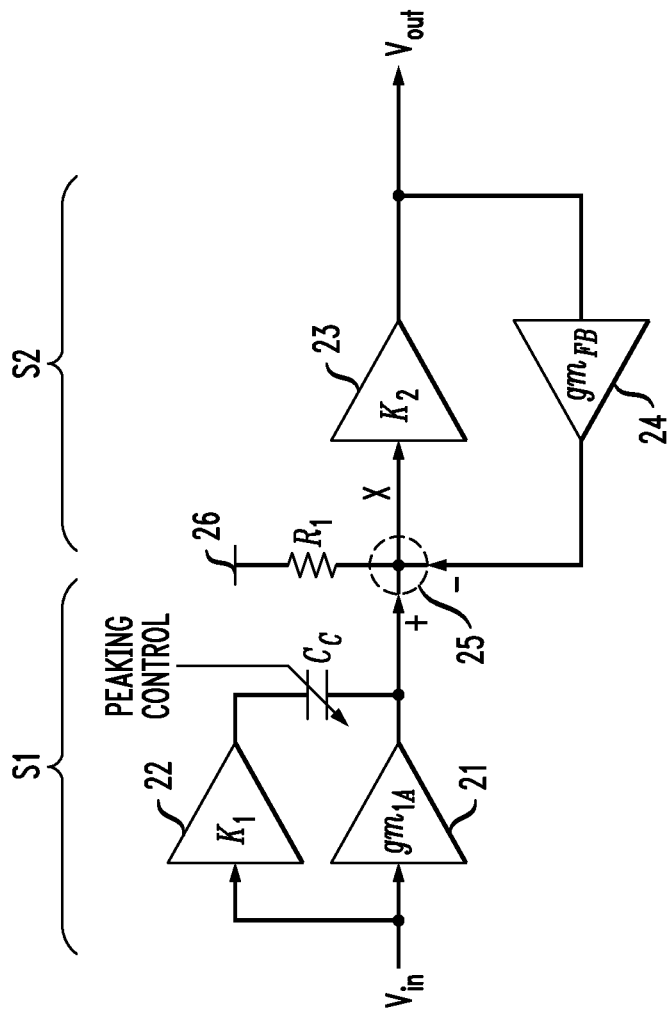
FIG. 2 is a high-level schematic diagram of a peaking amplifier according to an exemplary embodiment of the invention.

FIG. 2 is a high-level schematic diagram of a peaking amplifier according to an exemplary embodiment of the invention. In general, FIG. 2 shows a peaking amplifier 20 that provides enhanced peaking capability by adopting a two-stage architecture with active feedback, to which a parallel input amplifier stage is capacitively coupled. More specifically, the peaking amplifier 20 comprises a first stage S1 and a second stage S2. The first stage S1 comprises a first input amplifier 21 (with transconductance $gm_{1A}$) and a second input amplifier 22 (with voltage gain $K_1$). The second stage S2 comprises forward-path gain amplifier stage 23 (with voltage gain $K_2$), and an active feedback amplifier stage 24 (with transconductance $gm_{FB}$).

The first and second input amplifiers 21 and 22 have inputs that are commonly connected to an input of the amplifier (i.e., the first and second input amplifiers 21 and 22 commonly receive an input voltage Vin). The output of the first input amplifier 21 is connected to a feedback node 25 of the amplifier 20. The output of the second input amplifier 22 is capacitively coupled to the output of the first input amplifier 21 by a variable coupling capacitor $C_C$ (the output of the second input amplifier 22 is capacitively coupled to the feedback node 25). The output of the first input amplifier 21 is connected to a load resistor $R_1$. The load resistor R1 is connected between the feedback node 25 and a supply voltage node 26. As discussed in further detail below, the value of the coupling capacitor $C_C$ can be variably controlled by use of a control scheme that generates a peaking control signal to adjust the value of $C_C$. In other exemplary embodiments, the coupling capacitor $C_C$ can be a fixed capacitor with a fixed value.

In the second stage S2, the input of the forward-path gain amplifier stage 23 is connected to the feedback node 25, and the output of the forward-path gain amplifier stage 23 is connected to an output node Vout of the amplifier 20. The input of the active feedback amplifier stage 24 is connected to the output node Vout of the amplifier 20, and an output of the active feedback amplifier stage 24 is connected to the feedback node 25 of the amplifier 20. The active feedback amplifier stage 24 shares the same load resistor $R_1$ with first input amplifier stage 21.

Collectively, the input amplifier stage 21 (with transconductance $gm_{1A}$), the forward-path gain amplifier stage 23 (with voltage gain $K_2$), the active feedback amplifier stage 24 (with transconductance $gm_{FB}$), and the load resistor $R_1$ comprise a two-stage amplifier with active feedback, which commonly operates as a broadband feedback amplifier under DC and low operating frequencies. The second input amplifier stage 22, which is coupled through the coupling capacitor $C_C$ to the outputs (dotted together at the feedback node 25) of the first input amplifier stage 21 and the active feedback amplifier stage 24, is designed to add zero-peaking characteristics to the amplifier 20 at higher operating frequencies.

In particular, the second input amplifier stage 22 is designed to have an output impedance which is at least the same or lower (or preferably much lower) than $R_1$ (the output impedance of the first input amplifier stage 21 and the active feedback amplifier stage 24). Moreover, the second input amplifier stage 22 is designed to have a voltage gain ($K_1$) that is preferably at least as high as $gm_{1A} \cdot R_1$ (the voltage gain of first input amplifier stage 21). The capacitive coupling of the output of the second input amplifier stage 22 to the outputs of the first input amplifier stage 21 and the active feedback amplifier stage 24 boosts the high-frequency gain (relative to the DC gain) and thereby converts the circuit into a peaking amplifier.

More specifically, at DC (and low frequencies), the second input amplifier stage 22 has no effect on the rest of the amplifier circuit, and the gain of the peaking amplifier 20 is relatively low due to negative feedback provided by the active feedback amplifier stage 24. At high frequencies, the coupling capacitor $C_C$ effectively shorts the output of second input amplifier stage 22 to the outputs of first input amplifier stage 21 and the active feedback amplifier stage 24. Because the second input amplifier stage 22 has an output impedance which is lower (preferably much lower) than $R_1$, a strong capacitive coupling suppresses the feedback from the active feedback amplifier stage 24, and the high-frequency gain of the peaking amplifier approaches that of a two-stage open-loop amplifier, i.e., an amplifier comprising stages 22 and 23. Since a two-stage open-loop amplifier provides higher gain than a one-stage open-loop amplifier, the peaking amplifier 20 is capable of achieving higher levels of peaking than the zero-peaked differential amplifier as shown in FIG. 1. The level of peaking can be adjusted by varying the value of coupling capacitance $C_C$. Moreover, the exemplary peaking amplifier of FIG. 2 has another advantage in that it exhibits little variation in input capacitance with peaking level.

As shown in the exemplary embodiment of FIG. 2, the first input stage 21 and the active feedback amplifier stage 24 are implemented as transconductance amplifier stages that share the load resistor $R_1$. The second input stage 22 and forward-path gain stage 23 are depicted as generic amplifiers stages having gains of K1 and K2, respectively. In some exemplary embodiments of the invention, the second input amplifier stage 22 and/or the forward-path gain stage 23 may be implemented with circuit topologies similar to those used for the first input amplifier stage 21 and the active feedback amplifier stage 24. For example, the second input amplifier stage 22 or the forward-path gain stage 23 or both stages 22 and 23 may be implemented as transconductance amplifier stages. In other exemplary embodiments of the invention, the second input amplifier stage 22 and/or the forward-path gain stage 23 may be implemented using other suitable amplifier topologies other than transconductance amplifier topologies. Moreover, although exemplary embodiments of the invention as discussed herein depict the feedback stage 24 as being an active feedback amplifier stage, in other exemplary embodiments of the invention, the feedback stage 24 may be implemented as a passive feedback network formed of passive circuit elements using circuit topologies known to those of ordinary skill in the art.

Figure 3:
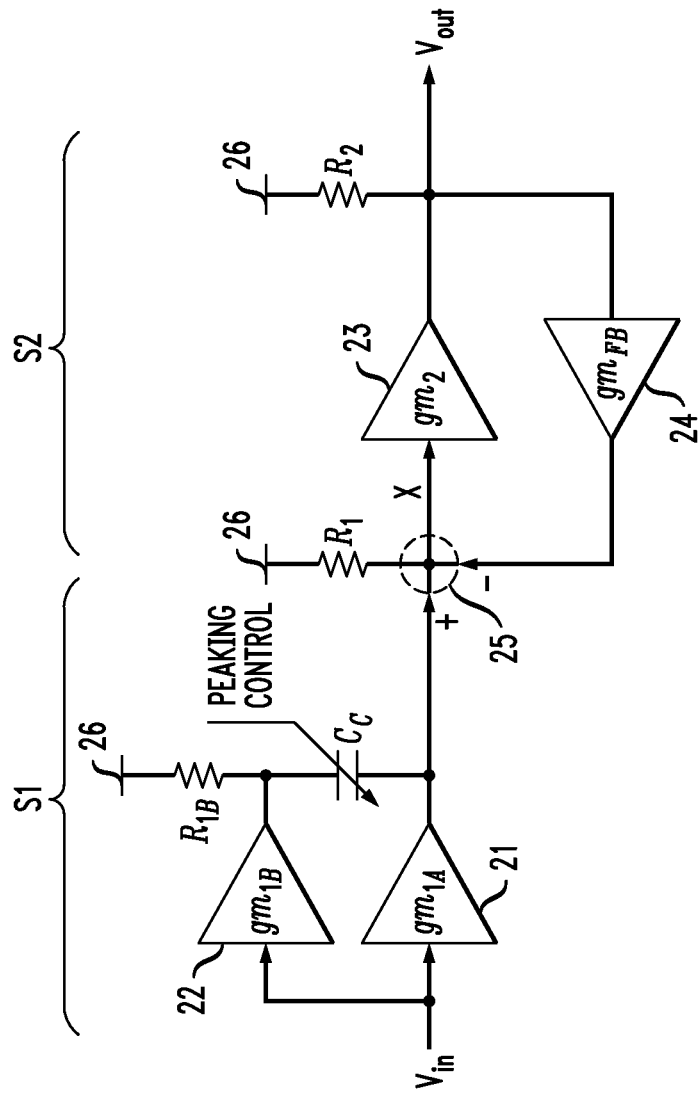
FIG. 3 is a high-level schematic diagram of a peaking amplifier according to another exemplary embodiment of the invention.

FIG. 3 is a high-level schematic diagram of a peaking amplifier according to another exemplary embodiment of the invention. FIG. 3 illustrates a peaking amplifier 30 which is similar to that of FIG. 2, but with the second input amplifier stage 22 and the forward-path gain stage 23 modeled as respective transconductance stages $gm_{1B}$ and $gm_2$, driving respective load resistors $R_{1B}$ and $R_2$. The voltage gain ($K_1$) of second input amplifier stage 22 equals $gm_{1B} \cdot R_{1B}$ and the voltage gain ($K_2$) of the forward-path gain stage 23 equals $gm_2 \cdot R_2$. Since it is desirable that the output impedance of second input amplifier stage 22 be much lower than that of the first input amplifier stage 21 and the active feedback amplifier stage 24, it is desirable that $R_{1B} \ll R_1$.

The voltage gain of the second amplifier stage 22 is typically higher than that of the first input amplifier stage 21. In the active feedback structure, the DC bias currents for transconductance stages $gm_{1A}$ and $gm_{FB}$ both flow through the load resistor $R_1$. The total DC current flowing through the load resistor $R_1$ is limited by the need to maintain adequate voltage headroom for the devices. Since some of the DC bias current must be shared with the active feedback amplifier stage 24, first input amplifier stage 21 cannot be biased for the highest possible gain. On the other hand, the coupling capacitor $C_C$ isolates the DC bias of the second input amplifier stage 22 from that of the other stages 21, 23 and 24. Therefore the biasing of the second input amplifier stage 22 with its own load resistor $R_{1B}$ can be independently optimized for maximum gain, where $gm_{1B} \cdot R_{21B}$ is typically greater than $gm_{1A} \cdot R_1$. This helps improve the maximum peaking of the amplifier 30 since (as shown below) the high-frequency gain of the peaking amplifier 30 is limited by $gm_{1B} \cdot R_{1B}$ more than by $gm_{1A} \cdot R_1$.

The operating characteristics of the peaking amplifier 30 of FIG. 3 can be understood better by the following equations. With the topology of the amplifier 30 of FIG. 3, the closed-loop DC gain is given by:

$$A_V = \frac{V_{out}}{V_{in}} = \frac{gm_{1A} \cdot R_1 \cdot gm_2 \cdot R_2}{1 + gm_{FB} \cdot R_1 \cdot gm_2 \cdot R_2}.$$

In a serial link for data communications, the low-frequency component of the signal is hardly attenuated, and normally the peaking amplifier 30 does not have to provide much DC signal gain. The DC gain is often set to be roughly 0 dB by choosing proper values of $gm_{1A}$, $gm_{FB}$, $R_1$, $gm_2$, and $R_2$.

As discussed above, the peaking behavior of higher signal gain at high frequencies is achieved by capacitive coupling of the second input amplifier stage 22 to the outputs of the first input amplifier stage 21 and the active feedback amplifier stage 24. Considering an extreme case where the coupling capacitance is infinite, the signal gain at high frequencies can be expressed as:

$$A_V = \frac{V_{out}}{V_{in}} = \frac{(gm_{1A} + gm_{1B}) \cdot (R_1 // R_{1B}) \cdot gm_2 \cdot R_2}{1 + gm_{FB} \cdot (R_1 // R_{1B}) \cdot gm_2 \cdot R_2}, \text{ if } C_C \to \infty.$$

As one can see from the numerator of the equation, the presence of the second input stage 22 increases the input signal gain. Since $gm_{1B} \cdot R_{1B} > gm_{1A} \cdot R_1$, it follows that $(gm_{1A} + gm_{1B}) \cdot (R_1 // R_{1B}) > gm_{1A} \cdot R_1$.

Moreover, the second input amplifier stage 22 decreases the high-frequency feedback loop gain as the active feedback amplifier stage 24 sees an additional load resistance $R_{1B}$, as evidenced by the $R_1 // R_{1B}$ term in the denominator. The benefit of this topology is maximized when the second input amplifier stage 22 is designed much stronger such that $gm_{1B} \gg gm_{1A}$ and $R_{1B} \ll R_1$. In this case, the signal gain at high frequencies can be approximated as:

$$A_V = \frac{V_{out}}{V_{in}} \approx \frac{gm_{1B} \cdot R_{1B} \cdot gm_2 \cdot R_2}{1 + gm_{FB} \cdot R_{1B} \cdot gm_2 \cdot R_2}.$$

One can further ignore the $gm_{FB} \cdot R_{1B} \cdot gm_2 \cdot R_2$ term in the denominator considering the fact that $gm_2 \cdot R_2$ is not too high (e.g. ≈2) with current technologies, $gm_{FB} \cdot R_1$ is smaller yet, and $R_{1B} \ll R_1$. Therefore, the equation above can be further reduced to:

$$A_V = \frac{V_{out}}{V_{in}} \approx gm_{1B} \cdot R_{1B} \cdot gm_2 \cdot R_2.$$

The above derivation shows that the fundamental limit of the maximum high-frequency gain of this structure is $gm_{1B} \cdot R_{1B} \cdot gm_2 \cdot R_2$ which is the open-loop gain of two CML stages. In a practical implementation (for instance, with finite value of capacitor $C_C$ or a somewhat more modest ratio of $gm_{1B}$ to $gm_{1A}$), this fundamental limit of the maximum high-frequency gain can be better approached by including a low-pass filter in the feedback path between the output node Vout of the amplifier and the input of the active feedback stage to decrease further the feedback factor at high frequencies.

Figure 4:
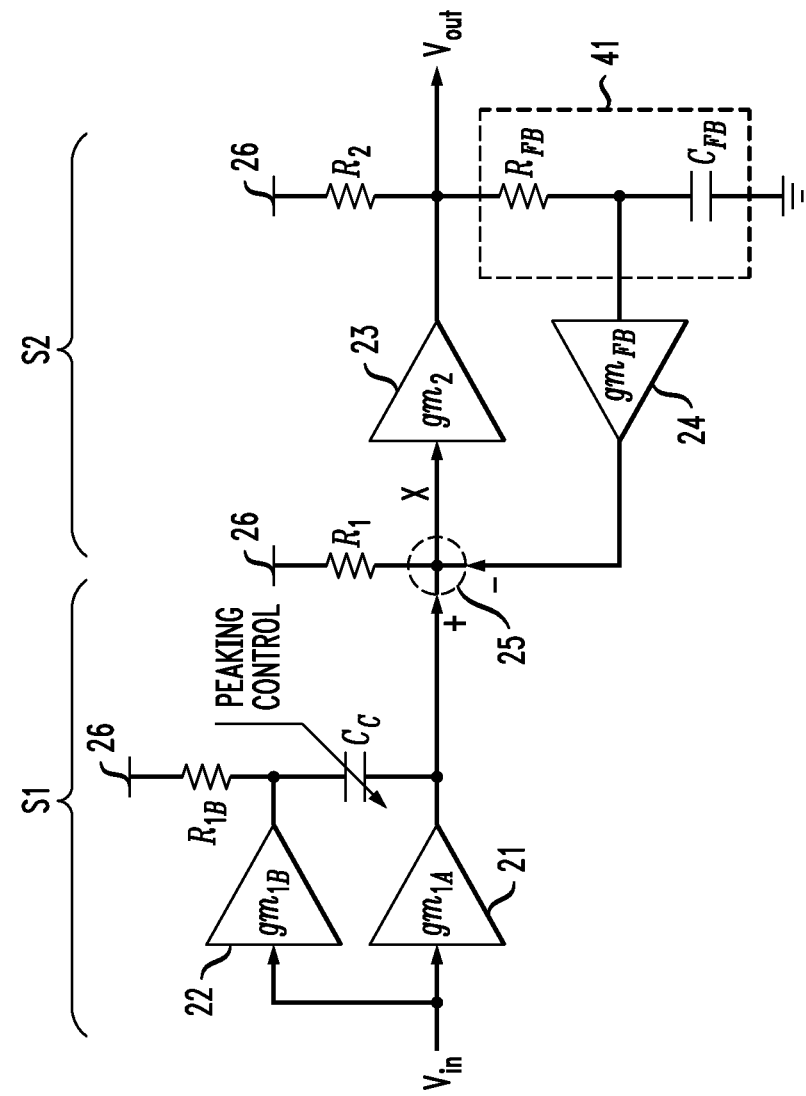
FIG. 4 is a high-level schematic diagram of a peaking amplifier according to another exemplary embodiment of the invention.

For example, FIG. 4 is a high-level schematic diagram of a peaking amplifier according to another exemplary embodiment of the invention. FIG. 4 illustrates a peaking amplifier 40 which is similar to that of FIG. 3, but with a low-pass filter 41 at the input of the active feedback amplifier stage 24. As depicted in FIG. 4, the low-pass filter 41 may be implemented as a simple passive RC filter, comprising resistor $R_{FB}$ and capacitor $C_{FB}$. In the exemplary embodiment of FIG. 4, the time constant of the low-pass filter 41 is $R_{FB} C_{FB}$, which can be optimized to yield the best overall frequency response of the peaking amplifier 40. The capacitor $C_{FB}$ can be either an explicit capacitor added to the circuit or the parasitic input capacitance of the active feedback amplifier stage 24.

In the exemplary peaking amplifier topologies discussed herein, it is to be appreciated that the input capacitance of the peaking amplifier stays relatively constant, as the preceding stage always sees a constant Miller effect from both the first and second input amplifier stages 21 and 22, regardless of the peaking settings. Because the DC gain of the peaking amplifier is determined by the closed-loop behavior, the variability of the DC gain over process, voltage, and temperature (PVT)

corners is relatively small. The closed-loop operation also reduces the signal swing at the feedback node 25 (as depicted in FIGS. 2, 3 and 4), which improves the linearity and reduces distortion.

Figure 5:
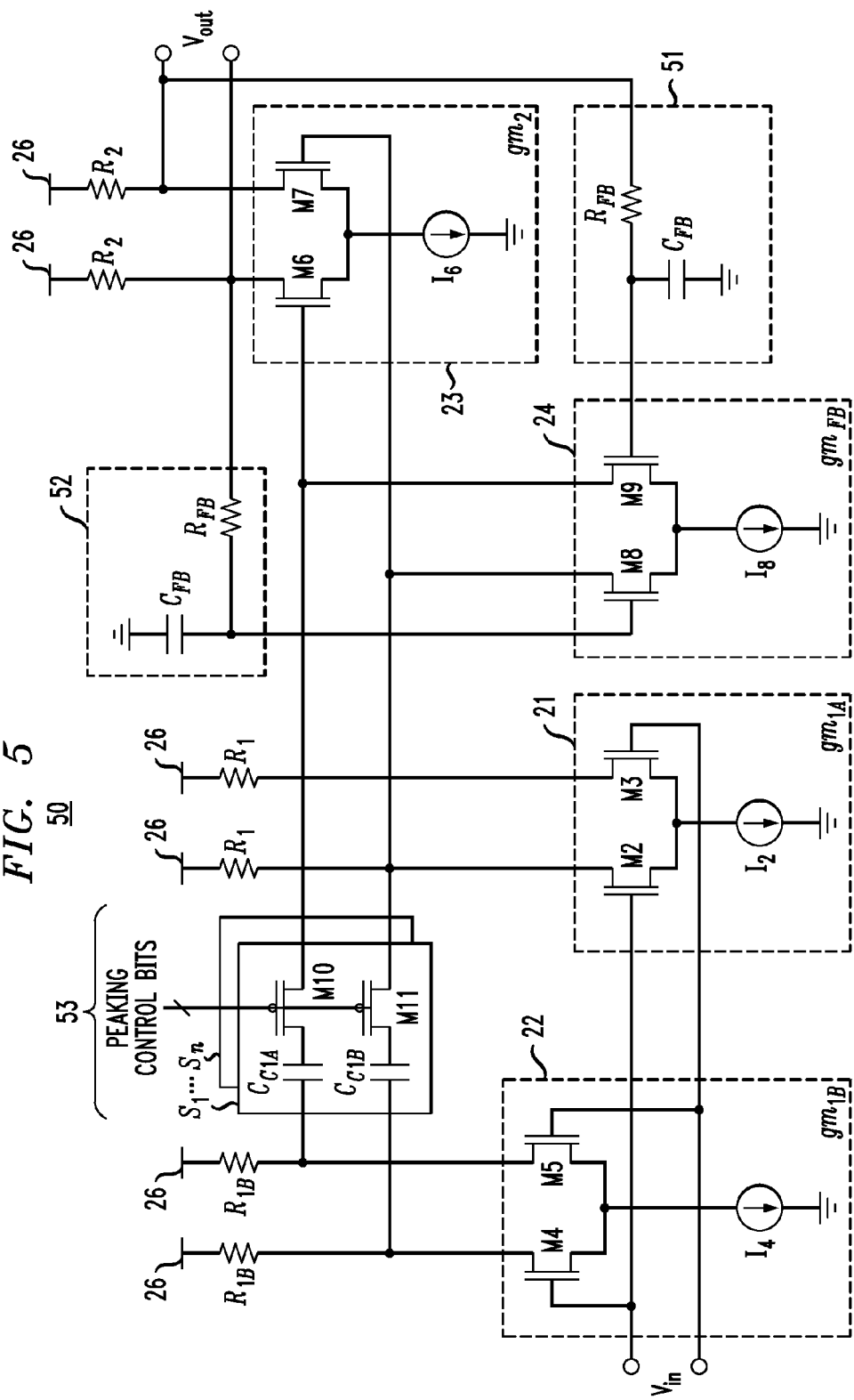
FIG. 5 is a schematic circuit diagram of a peaking amplifier according to another exemplary embodiment of the invention.

In other exemplary embodiments of the invention, a peaking amplifier may be constructed having a fully differential framework, which improves the power-supply rejection ratio (PSRR) of the circuits. For a fully differential framework, the transconductance (gm) stages 21, 22, 23, and 24 of FIG. 4, for example, can be designed with CML topologies. For example, FIG. 5 is a schematic circuit diagram of a peaking amplifier which is based on the high-level framework of FIG. 4, according to an exemplary embodiment of the invention. In particular, FIG. 5 illustrates an exemplary embodiment of a peaking amplifier 50 wherein each of the amplifier stages 21, 22, 23 and 24 are implemented as a resistor-loaded current-mode logic (CML) stage. In particular, as shown in FIG. 5, the first input amplifier stage 21 is a differential input stage formed by differential transistor pair M2 and M3 and load resistors R1 and tail current source I2. The second input amplifier stage 22 is a differential input stage formed by differential transistor pair M4 and M5 and load resistors $R_{1B}$ and tail current source I4. The forward-path gain stage 23 is a differential input stage formed by differential transistor pair M6 and M7 and load resistors R2 and tail current source I6. The active feedback amplifier stage 24 is a differential input stage formed by differential transistor pair M8 and M9 and load resistors R1 (shared with the first input stage 21) and tail current source I8.

The peaking amplifier 50 further comprises a first low-pass filter circuit 51 (comprising resistor $R_{FB}$ and capacitor $C_{FB}$) connected at the input of the transistor M9 of the differential stage of the active feedback amplifier stage 24 and a second low-pass filter circuit 52 connected at the input of the transistor M8 of the differential stage of the active feedback amplifier stage 24, which comprises resistor $R_{FB}$ and capacitor $C_{FB}$ similar to the first low-pass filter 51.

The peaking amplifier 50 further comprises a peaking control circuit 53 comprising a plurality of parallel connected switch-controlled coupling capacitor circuits S1, . . . Sn, which capacitively couple the differential outputs of the differential stage M4/M5 of the second input amplifier stage 22 to the differential outputs of the differential stage M2/M3 of the first input amplifier stage 21. For instance, each parallel connected switch-controlled coupling capacitor circuit S1, . . . , Sn comprises a pair of capacitors and a pair of switches serially connected between the differential outputs of the first input amplifier stage 21 and the second input amplifier stage 22.

In particular, as shown in FIG. 5, a first switch-controlled coupling capacitor circuit S1 includes a coupling capacitor $C_{C1A}$ and switch M10 serially connected between the drain (output) nodes of transistors M5 and M3 of the first and second input amplifier stages 21 and 22, and a coupling capacitor $C_{C1B}$ and switch M11 serially connected between the drain (output) nodes of transistors M4 and M2 of the first and second input amplifier stages 21 and 22. The remaining switch-controlled coupling capacitor circuits S2, Sn have the same framework as S1, wherein each pair of capacitors $C_{CnA}$/$C_{CnB}$ in a set (S1, S2, . . . Sn) of parallel connected pairs of capacitors $C_{C1A}$/$C_{C1B}$, $C_{C2A}$/$C_{C2B}$, . . . $C_{CnA}$/$C_{CnB}$, may have the same capacitance value, or different capacitor values (such as binary weighted values).

With this design, "peaking control" bits are applied to the switch-controlled coupling capacitor circuits S1, . . . Sn to either turn "ON" or "OFF" the switches M10/M11, so that the amount of coupling capacitance can be digitally adjusted. In one exemplary embodiment as shown in FIG. 5, the switches M10/M11 are implemented as PMOS transistors. In the exemplary embodiment of FIG. 5 wherein NMOS transistors are utilized for constructing the differential stages, the use of PMOS switches in the switch-controlled coupling capacitor circuits S1, . . . Sn is preferred because the output common-mode voltages of NMOS-based CML stages tend be high. Alternatively, the switches M10/M11 used to select different amounts of coupling capacitance can be implemented as transmission gates with both NMOS and PMOS transistors. In other exemplary embodiments, the entire peaking amplifier 50 can be constructed from complementary devices (for instance, PMOS-based CML stages and NMOS switches).

Figure 6:
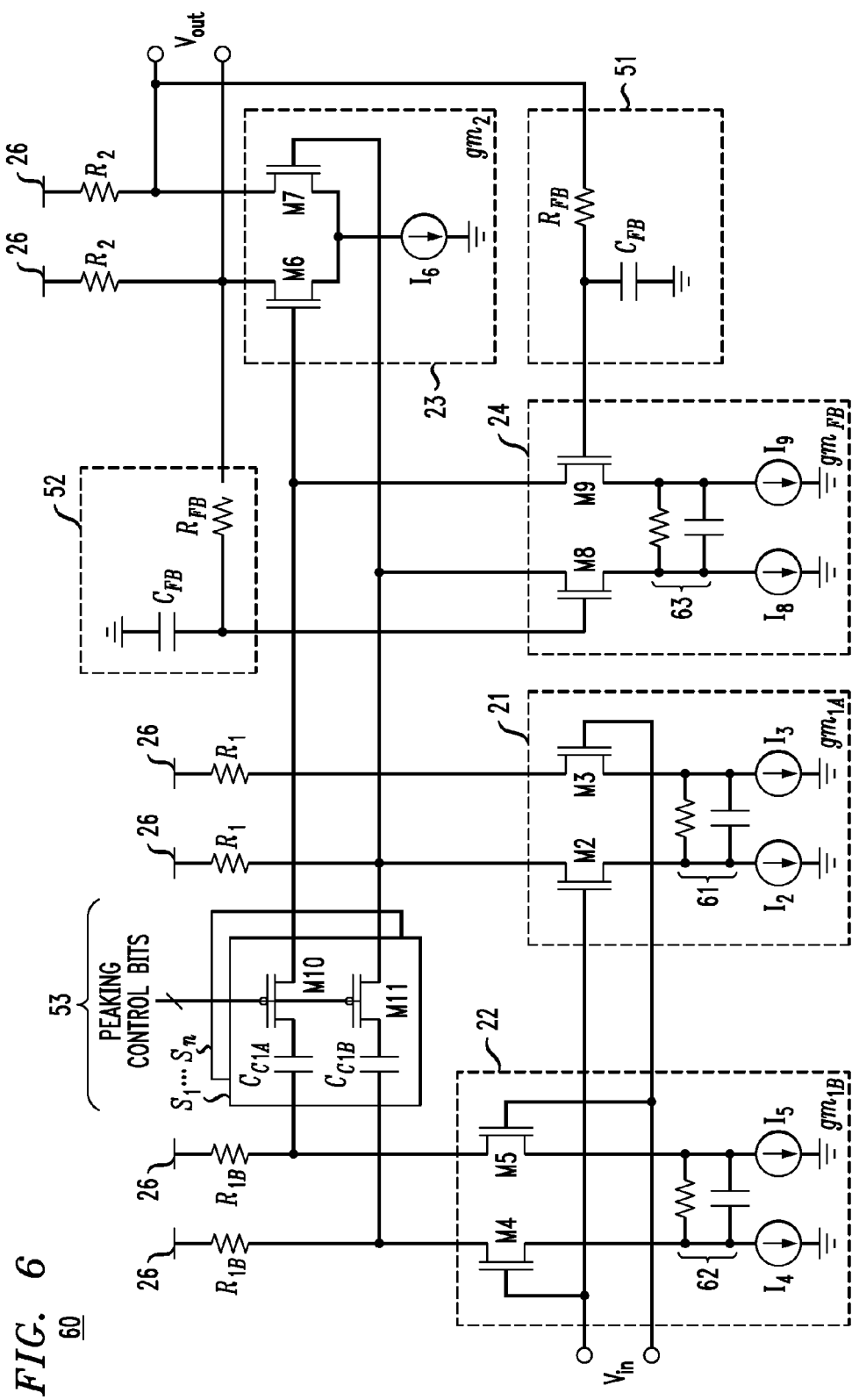
FIG. 6 is a schematic circuit diagram of a peaking amplifier according to another exemplary embodiment of the invention.

FIG. 6 is a schematic circuit diagram of a peaking amplifier according to another exemplary embodiment of the invention. FIG. 6 illustrates a peaking amplifier 60 which is similar to that of FIG. 5, but with the differential amplifier stages modified to include RC degeneration networks for improved linearity and bandwidth extension. In particular, FIG. 6 depicts an exemplary embodiment of a peaking amplifier 60 in which RC degeneration networks 61, 62 and 63 (including resistive degeneration and capacitive degeneration) are employed in the first input amplifier stage 21, the second input amplifier stage 22, and the active feedback amplifier stage 24. The use of the resistive degeneration in the transconductance stages improves linearity and reduces distortion with larger signals. In addition, capacitive degeneration can be used together with the resistive degeneration to enhance the bandwidth of the individual stages. In the exemplary framework of FIG. 6, the degeneration capacitors in the degeneration networks 61, 62 and 63 are primarily used for bandwidth extension (not the peaking function itself) so their values are fixed (not adjustable). In other exemplary embodiments of the invention, the degeneration capacitors may be variable capacitors to allow for further tuning of the circuit.

In the exemplary embodiments of FIGS. 2-6, the coupling capacitor $C_C$ is depicted as being a variable capacitor that is adjusted by a peaking control signal. The plurality of switches M10 and M11 as shown in FIGS. 5 and 6 are elements of a control circuit in which the peaking control signal is generated to selectively turn on/off the switches and adjust the coupling capacitance. Other components of the control circuit (not specifically shown) are included to provide static or dynamic control schemes for adjusting the value of the coupling capacitance. For instance, the control circuit may further include a plurality of registers that are programmed by a user to include the configuration bits that specify the amount of coupling capacitance that is user-selected. With this static control scheme, the digital values of the peaking control signal are manually set by the user to select a fixed value for the coupling capacitance, wherein this value will be applied until further programming by the user.

In other embodiments, a dynamic control scheme may be implemented, wherein the peaking control signal is dynamically generated to dynamically adjust the value of the coupling capacitance under changing operating conditions. In particular, a control circuit can be employed to receive as input certain data regarding operating conditions, e.g., data rates, channel loss, etc., and then dynamically output a peaking control signal to dynamically adjust the value of the coupling capacitance, e.g., to change the coupling capacitance value to reduce/increase peaking gain at a given operating frequency, or to adjust the value of the coupling capacitance to provide an optimal peaking for a different data rate of the input signal that is received by the amplifier, etc.

In other exemplary embodiments of the invention, the coupling capacitor shown in the embodiments of FIGS. 2-6 can be implemented using a fixed capacitor value. In this circumstance, the coupling capacitor will have a value that is selected to realize an optimal or desired peaking response for a given operating frequency of the peaking amplifier.

Figure 7:
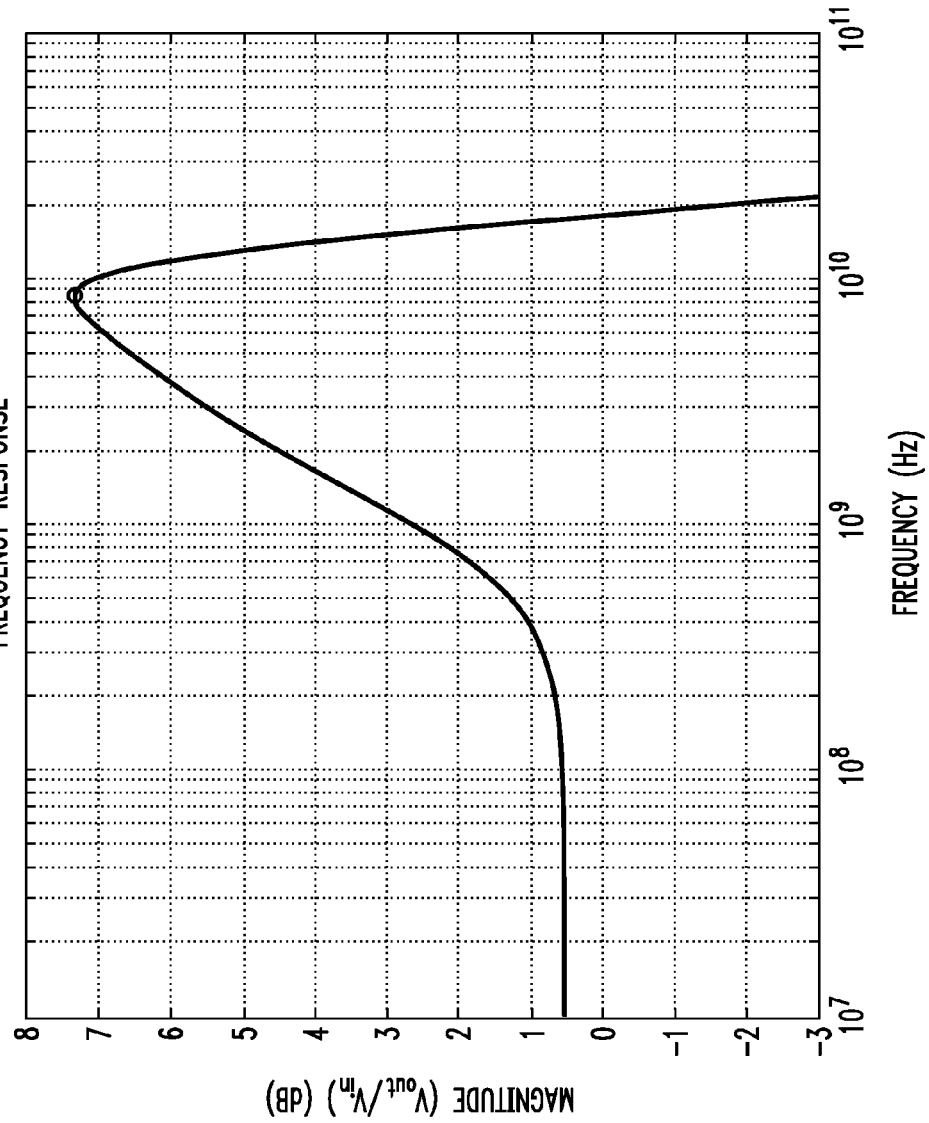
FIG. 7 is a simulated frequency response of a peaking amplifier based on the circuit framework of FIG. 6.

In order to evaluate performance of a peaking amplifier according to principles of the invention, a circuit simulation was performed for a simulated peaking amplifier circuit having a framework as depicted in FIG. 6. FIG. 7 shows a simulated frequency response of the circuit of FIG. 6 implemented in 32 nm CMOS silicon-on-insulator (SOI) technology. The simulation result indicates that the peaking at 9 GHz equals 6.8 dB (relative to a DC gain of 0.55 dB). While a two-stage CML amplifier can provide about 10-12 dB of gain in current technologies, the bandwidth limitation of the devices reduces the maximum peaking by a few dB. Nonetheless, the peaking demonstrated in FIG. 7 is still significantly (≈3 dB) better than that of a standard zero-peaked differential amplifier as shown in FIG. 1, whose maximum peaking would also be degraded by bandwidth limitations.

Further aspects of the present invention provide peaking amplifiers which can be utilized in integrated circuit chips with various analog and digital integrated circuitries. In particular, integrated circuit dies can be fabricated having peaking amplifiers and other semiconductor devices such as field-effect transistors, bipolar transistors, metal-oxide-semiconductor transistors, diodes, resistors, capacitors, inductors, etc., forming analog and/or digital circuits. The peaking amplifiers can be formed upon or within a semiconductor substrate, the die also comprising the substrate. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A peaking amplifier circuit, comprising:
an input node, and output node and a feedback node;
a first input amplifier having an input connected to the input node and an output connected to the feedback node;
a second input amplifier having an input connected to the input node;
a coupling capacitor connected between an output of the second input amplifier and the feedback node;
a forward-path gain amplifier having an input connected to the feedback node and an output connected to the output node; and
a feedback circuit having an input coupled to the output node and an output connected to the feedback node.

2. The peaking amplifier circuit of claim 1, wherein the feedback circuit is an active feedback amplifier.

3. The peaking amplifier circuit of claim 2, wherein the first input amplifier and the active feedback amplifier are transconductance amplifiers that share a same load resistor.

4. The peaking amplifier circuit of claim 3, wherein the second input amplifier is a transconductance amplifier.

5. The peaking amplifier circuit of claim 3, wherein the forward-path gain amplifier is a transconductance amplifier.

6. The peaking amplifier circuit of claim 2, further comprising a low-pass filter circuit connected between the output of the forward-path gain amplifier and the input of the active feedback amplifier.

7. The peaking amplifier circuit of claim 1, wherein the second input amplifier has an output impedance that is lower than an output impedance of the first input amplifier.

8. The peaking amplifier circuit of claim 1, wherein the second input amplifier has a voltage gain that is at least equal to or greater than a voltage gain of the first input amplifier.

9. The peaking amplifier circuit of claim 1, wherein the coupling capacitor is a variable coupling capacitor.

10. The peaking amplifier circuit of claim 9, further comprising a control circuit to vary a capacitance of the variable coupling capacitor to tune a peaking response of the peaking amplifier circuit.

11. The peaking amplifier circuit of claim 10, wherein the variable coupling capacitor comprises a plurality of n capacitors connected in parallel, wherein the control circuit comprises a plurality of switching elements that are switchably controlled by a peaking control signal to switchably connect corresponding ones of the n capacitors to the feedback node.

12. The peaking amplifier circuit of claim 2, wherein the first input amplifier, the second input amplifier, the forward-path gain amplifier, and the active feedback amplifier are implemented as differential current-mode logic (CML) stages.

13. The peaking amplifier circuit of claim 12, wherein each of the first input amplifier, the second input amplifier, and the active feedback amplifier further comprises a degeneration network.

14. The peaking amplifier circuit of claim 13, wherein the degeneration network comprises a resistor and a capacitor.

15. An integrated circuit chip, comprising:
an integrated circuit comprising a peaking amplifier circuit, wherein the peaking amplifier circuit comprises:
an input node, an output node and a feedback node;
a first input amplifier having an input connected to the input node and an output connected to the feedback node;
a second input amplifier having an input connected to the input node;
a coupling capacitor connected between an output of the second input amplifier and the feedback node;
a forward-path gain amplifier having an input connected to the feedback node and an output connected to the output node; and
a feedback circuit having an input coupled to the output node and an output connected to the feedback node.

16. The integrated circuit chip of claim 15, wherein the feedback circuit is an active feedback amplifier.

17. The integrated circuit chip of claim 16, wherein the first input amplifier and the active feedback amplifier are transconductance amplifiers that share a same load resistor.

18. The integrated circuit chip of claim 16, wherein the peaking circuit further comprises a low-pass filter circuit connected between the output of the forward-path gain amplifier and the input of the active feedback amplifier.

19. The integrated circuit chip of claim 15, wherein the coupling capacitor is a variable coupling capacitor.

20. The integrated circuit chip of claim 19, further comprising a control circuit to vary a capacitance of the variable coupling capacitor to tune a peaking response of the peaking amplifier circuit.

21. The integrated circuit chip of claim 16, wherein the first input amplifier, the second input amplifier, the forward-path gain amplifier, and the active feedback amplifier are implemented as differential current-mode logic (CML) stages.

22. The integrated circuit chip of claim 21, wherein each of the first input amplifier, the second input amplifier, and the active feedback amplifier further comprises a degeneration network.

23. A method for amplifying a signal by a peaking amplifier, comprising:
- receiving an input signal at an input of first and second input amplifiers;
- amplifying the input signal with the first and second input amplifiers;
- applying an output of the first input amplifier to a feedback node to which negative feedback is applied to reduce a gain of the peaking amplifier at DC and low operating frequencies; and
- capacitively coupling an output of the second input amplifier to the feedback node to suppress the negative feedback and increase the gain of the peaking amplifier at high operating frequencies.

* * * * *